United States Patent

Mueller

Patent Number: 6,141,781
Date of Patent: Oct. 31, 2000

[54] PROCESS FOR EDITING OF DATA, IN PARTICULAR WITH VARIABLE CHANNEL BIT RATE

[75] Inventor: Joerg-Martin Mueller, Schwaikheim, Germany

[73] Assignee: Robert Bosch GmbH, Stuttgart, Germany

[21] Appl. No.: 09/125,232

[22] PCT Filed: Dec. 19, 1996

[86] PCT No.: PCT/DE96/02465

§ 371 Date: Mar. 4, 1999

§ 102(e) Date: Mar. 4, 1999

[87] PCT Pub. No.: WO97/30530

PCT Pub. Date: Aug. 21, 1997

[30] Foreign Application Priority Data

Feb. 14, 1996 [DE] Germany ............... 196 05 418

[51] Int. Cl.[7] ............................................. G01R 31/28
[52] U.S. Cl. .................... 714/722; 375/225; 714/701
[58] Field of Search ........................... 714/712, 701; 375/225, 224

[56] References Cited

U.S. PATENT DOCUMENTS

| | | | |
|---|---|---|---|
| 5,469,471 | 11/1995 | Wheatley, III | 370/335 |
| 5,668,810 | 9/1997 | Cannella, Jr. | 370/392 |
| 5,745,532 | 4/1998 | Campana, Jr. | 375/347 |
| 5,854,840 | 12/1998 | Cannella, Jr. | 380/9 |

FOREIGN PATENT DOCUMENTS

| | | |
|---|---|---|
| 0 643 493 | 3/1995 | European Pat. Off. . |
| 41 37 609 | 5/1993 | Germany . |

OTHER PUBLICATIONS

F.J. Furrer, "Fehlerkorrigierende Block–Codierung für die Datenübertragung", Birkhäuser–Verlag, Basel, 1981, p. 270.* (No translation).

*Primary Examiner*—Phung M. Chung
*Attorney, Agent, or Firm*—Kenyon & Kenyon

[57] ABSTRACT

For processing data, particularly for transmission via a channel with an specifiably variable data rate, the data are classified into bit classes that are provided with different error redundancy. These bit classes are also weighted with weighting factors. The assignment of the code rates for the bit classes takes place as a function of the respective weighting factors. It is possible to provide a scalable.

With the invention, it is possible to realize a scalable channel codec whose configuration is a function solely of the available channel codec bit rate. Such a channel codec is easy to adapt to different transmission techniques.

13 Claims, 3 Drawing Sheets

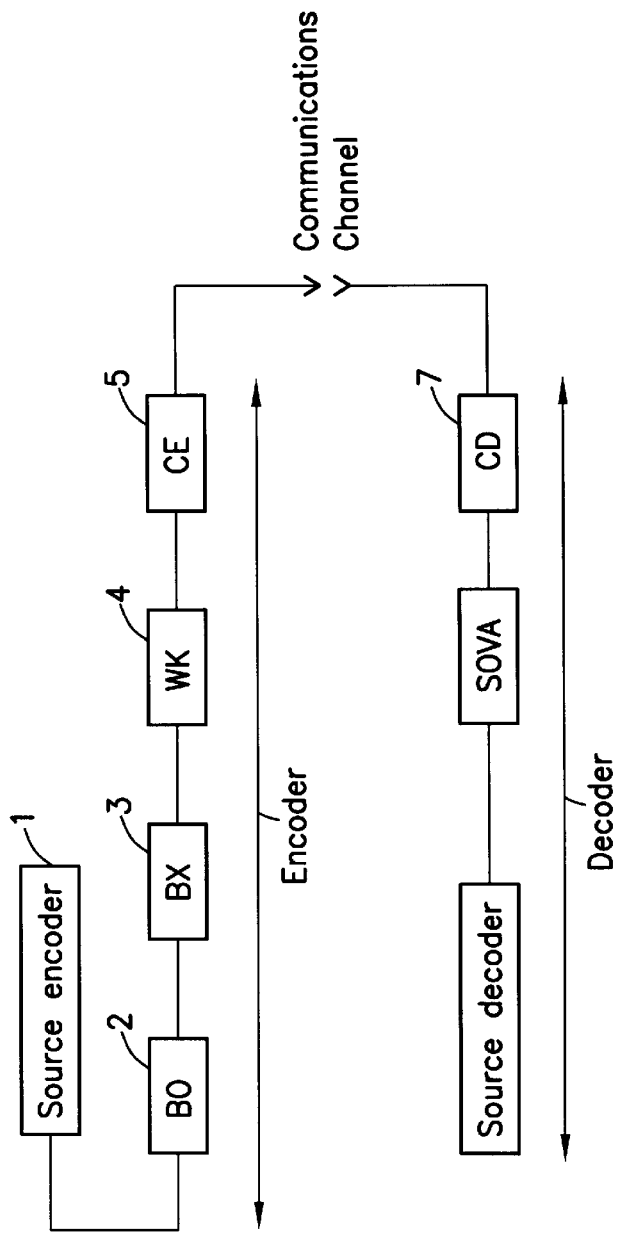

| Gross bit-rate | i | 0 | 1 | 2 | 3 | 4 | Prot. Info-bits |
|---|---|---|---|---|---|---|---|
| 8 kbit/s | c[i] | 24+3crc+9 | 54+4tail | 19 | 30 | 22 | 87 |
| | r[i] | $\frac{12}{24}$ | $\frac{12}{20}$ | $\frac{12}{12}$ | $\frac{12}{12}$ | $\frac{12}{12}$ | |
| 9 kbit/s | c[i] | 24+3crc+10 | 42 | 40+4tail | 20 | 22 | 116 |
| | r[i] | $\frac{12}{24}$ | $\frac{12}{23}$ | $\frac{12}{20}$ | $\frac{12}{12}$ | $\frac{12}{12}$ | |
| 10 kbit/s | c[i] | 24+3crc | 33 | 32 | 44+4tail | 25 | 133 |
| | r[i] | $\frac{12}{27}$ | $\frac{12}{26}$ | $\frac{12}{22}$ | $\frac{12}{21}$ | $\frac{12}{12}$ | |
| 11.4 kbit/s | c[i] | 24+3crc | 34 | 34 | 39+4tail | 23 | 135 |
| | r[i] | $\frac{12}{32}$ | $\frac{12}{30}$ | $\frac{12}{25}$ | $\frac{12}{23}$ | $\frac{12}{12}$ | |

Fig. 3

| Gross bit-rate | i | 0 | 1 | 2 | 3 | 4 | Prot. Info-bits |
|---|---|---|---|---|---|---|---|
| 9 kbit/s | c[i] | 29+3crc+38+4tail | 4 | 43 | 48 | 27 | 67 |
| | r[i] | $\frac{12}{24}$ | $\frac{12}{12}$ | $\frac{12}{12}$ | $\frac{12}{12}$ | $\frac{12}{12}$ | |
| 10 kbit/s | c[i] | 29+3crc+16 | 70+4tail | 16 | 31 | 27 | 115 |
| | r[i] | $\frac{12}{24}$ | $\frac{12}{21}$ | $\frac{12}{12}$ | $\frac{12}{12}$ | $\frac{12}{12}$ | |
| 11.4 kbit/s | c[i] | 29+3crc | 40 | 41 | 46+4tail | 33 | 156 |
| | r[i] | $\frac{12}{25}$ | $\frac{12}{25}$ | $\frac{12}{21}$ | $\frac{12}{20}$ | $\frac{12}{12}$ | |
| 12.4 kbit/s | c[i] | 29+3crc | 40 | 41 | 48+4tail | 31 | 158 |
| | r[i] | $\frac{12}{29}$ | $\frac{12}{27}$ | $\frac{12}{23}$ | $\frac{12}{22}$ | $\frac{12}{12}$ | |

Fig. 4

PROCESS FOR EDITING OF DATA, IN PARTICULAR WITH VARIABLE CHANNEL BIT RATE

FIELD OF THE INVENTION

The present invention relates to a method for processing data via a channel with a variable channel bit rate.

BACKGROUND INFORMATION

The standard H 324 M for mobile video telephone applications admits all possible mobile radio systems so that the requirement for an available data rate (channel bit rate) can be different. Even within a communications system, the available bit rate for speech and video channel codecs can be different.

German Patent Application No. 41 37 609 describes, a method for decoding binary signals from binary signals transmitted via a channel and processed using an error-correcting code is known. The bit error probability is evaluated and a decision made whether the received bits are correct or errored.

European Patent Application No. 0 643 493 describes an error correction method for a digital cellular radio system. This European Patent Application describes that data are divided into three different bit classes with different error protection. For the division into the different bit classes, evaluation of the speech sampled values takes place based on "A-factor analysis" and using speech intelligibility tests.

SUMMARY OF THE INVENTION

An adaptation of a channel codec for any transmission method can be achieved.

Unlike conventional transmission methods, a specific channel codec, e.g., a channel codec especially for GSM or DECT, does not need to be provided for each communications system, e.g., a mobile radio system. The method according to the present invention works reliably even if the available channel bit rate is unknown. According to the present invention, the configuration of a channel encoder and a corresponding channel decoder depends only on the available channel codec bit rate. Transmission according to G.723.1 Standard via mobile radio channels with different channel bit rates is possible without changing the channel encoder or decoder. The channel encoders or rather decoders only need be designed to be scalable, i.e., the code rate is changed in steps as a function of the channel bit rate.

BRIEF DESCRIPTION OF THE DRAWINGS

FIG. 1 shows a block diagram for data processing according to the present invention.

FIG. 2 shows exemplary embodiments for a bit distribution among bit classes and weighting factors of the bit classes.

FIG. 3 shows the bit distribution among the bit classes and a code rate for different channel bit rates.

FIG. 4 shows another embodiment of the bit distribution for a different transmission method.

DETAILED DESCRIPTION

As is shown in FIG. 1, the information bits of a source coder 1 to be processed, e.g., according to communications standard G.723.1, are arranged in a unit 2 as a function of their error sensitivity. The most sensitive bit is placed at the first location of the arranged data stream and the least sensitive bit at the last position. Determination of the error sensitivity of information bits is based on known measurement techniques that were proposed in conjunction with G.723.1. The data stream arranged in this manner is now divided into different bit classes c [i] (—block 3—) where, say, i=0, . . . , 4, with c [0] containing the most error-sensitive bits and c [4] the least error-sensitive bits. Then, a weighting factor w [i], i=0, . . . , 4 (—block 4—) is assigned to each bit class to control the allocation of the bit rate (code rate) r for the individual bit classes. The weighting factor w [i] is chosen as a function of the average error sensitivity of the respective bit class c [i]. Here, the code rate r indicates the ratio of the number of information bits k to the number of transmission bits n as described in Furrer, "Fehlerkorrigierende Block-Codierung für die Datenübertragung", [Error-Correcting Block Encoding for Data Communications] Birkhäuser-Verlag, Basel, 1981, p. 270):

$$r = k/n$$

If r=1, the information bits are transmitted unprotected. For r=½, each information bit is provided with a redundant error protection bit. The bits in class 4 receive no protection. Class c [0] contains c [0] −3 information bits and three parity check code bits that are added at the end of class c [0] within a data block. The data blocks with the different bit classes are accommodated in a transmission frame. Class c [0] is always provided with the highest error redundancy, e.g., with a minimum error protection rate (code rate r<=½). The other classes have no such high error protection (constraint).

Preferably for transmission, a short parity check code (3-bit parity check code) is used that is intended as an error-detecting code in the channel decoder to detect uncorrected errors (bad frame detection). Particularly when using a Viterbi decoder, the soft decision output information of the SOVA (Soft Decision Viterbi Algorithm) unit 8 can be used for "bad frame detection". With a constraint length of 5 (16 states) and a code of the code rate r=⅓, reliable transmission can be realized for an acceptable decoder expense. Higher constraint lengths no longer lead to a meaningful increase in coding gain. Higher code rates can be derived from the output code of the ⅓ rate through code pointing. The four bits (tail bits) terminating the code are always put at the end of the last protected bit class and receive the same code rate as this class. This yields a minimum number of channel codec bits per transmission frame:

$$B_{min} = c[0] + 4.$$

The maximum number of channel codec bits per transmission frame is achieved if all classes have the code rate r=⅓ including error protection:

$$B_{max} = 2 * \sum_{i=0}^{3} c[i] + 4.$$

If $B > B_{min}$ bits are available per transmission frame, in a first pass the average code rates r' [i], i=0, . . . 4 of the classes are determined, for example, according to the following equation:

$$r'[i] = \frac{12}{\text{MIN}\left[36, \text{NINT}\left(12*\left(1 + \frac{B*w[i]}{c[I]}\right)\right)\right]}$$

Here, NINT refers to the rounding to the nearest whole number (integer) For the code rate of bit class zero, the following condition must hold:

$$r'[0] <= 12/24$$

The condition $$\sum_{i=0}^{4} w[i] = 1.$$

must also be maintained.

To efficiently distribute the channel codec bits, particularly for mobile radio applications, an additional redundancy is used for the code rate according to the following equation:

$$r[i] = \begin{cases} 1 & \text{if } r'[i] > \frac{12}{20} \\ r'[i] & \text{otherwise} \end{cases}$$

If with the above equations less bits are assigned for a class than corresponds to the capacity of a block in the transmission frame, i.e., this block is not entirely filled up, then in a second pass bits of class i (i>1) are transferred into the class i−1 with the next higher error sensitivity until all bits are allocated to the corresponding error classes.

If more bits are allocated to a bit class than corresponds to the capacity of its block in the transmission frame, then in the second pass bits of class i (i<4) are transferred into the class i+1 until the maximum possible code rate is achieved.

FIG. 2 shows two possible suggestions for the bit distribution and the evaluation with the weighting factors w [i]. The configuration is modified somewhat. The "tail bits" are in the class with the lowest error redundancy transmission (this is class 3 since class 4 is transmitted unprotected. . . . The "parity check code bits" for error detection of the first class are designated with crc.

FIG. 3 shows a table for the specifiably variable data rates (channel bit rates) 8.0, 9.0, 10.0 and 11.4 kbit/s with the bit distribution and the corresponding code rate r [i]. For other transmission norms, e.g., according to G.723.1, other bit distributions and code rates arise (see FIG. 4).

The method according to the present invention is performed particularly during a connection setup phase in conjunction with a channel encoder 5 and the corresponding channel decoder 7 or each time that the variable channel bit rate is changed. This is possible theoretically for each transmission frame. The communications channel 6 is provided between channel encoder 5 and channel decoder 7. The source decoder 9 follows the soft decision unit 8.

In the present invention, the assignment of the error redundancy for each of the bit classes is changed continuously and as a function of the specifiably variable channel bit rate. The number of redundancy bits available in the transmission frame is thus distributed optimally to the bit classes using an assignment rule, the number of redundancy bit rates being allowed to change in 1-bit steps.

What is claimed is:

1. A method for processing data to be transmitted via a channel, the channel having a specifiable variable data rate, the method comprising the steps of:

a) dividing the data into predetermined bit classes, each of the predetermined bit classes corresponding to a respective error sensitivity;

b) weighting the predetermined bit classes using weighting factors, wherein each of the weighting factors is determined as a function of an average error sensitivity of a respective bit class of the predetermined bit classes;

c) providing predetermined error redundancy data to the predetermined bit classes, wherein at least one bit class of the predetermined bit classes which has a highest number of error-sensitive bits is provided with a higher error redundancy data of the predetermined error redundancy data; and d) assigning a code rate to a respective bit class of the predetermined bit classes as a function of a corresponding weighting factor of the respective bit class.

2. The method according to claim 1, wherein respective redundancy data of the error redundancy data for each class of the predetermined bit classes is continuously changed as a function of the specifiable variable data rate.

3. The method according to claim 1, further comprising the step of:

e) for each of the predetermined bit classes, selecting respective redundancy data of the error redundancy data for the at least one bit class so that a bit rate of the respective redundancy data is less than or equal to ½.

4. The method according to claim 3, wherein the bit rate is a ratio of information bits to transmission bits.

5. The method according to claim 1, further comprising the step of:

f) for each of the predetermined bit classes, setting respective redundancy data of the error redundancy data, for a particular bit class of the predetermined bit classes with a lowest error sensitivity, to zero.

6. The method according to claim 1, wherein the predetermined bit classes are provided in a transmission frame in a block-by-block manner.

7. The method according to claim 6, wherein, for each of the predetermined bit classes, respective redundancy data of the error redundancy data is provided at an end section of a corresponding bit class of the predetermined bit classes in a corresponding block.

8. The method according to claim 6, further comprising the step of:

h) when a particular bit class of the predetermined bit classes is not filled to a full capacity of a block in the transmission frame, transferring bits of the particular bit class having a first error sensitivity to a further bit class of the predetermined bit classes which has a second error sensitivity, the second error sensitivity being higher than the first error sensitivity.

9. The method according to claim 6, further comprising the step of:

I) when a particular bit class of the predetermined bit classes has more bits than a full capacity of a respective block in the transmission frame, transferring bits of the particular bit class which has a first error sensitivity to a further bit class with a second error sensitivity, the second error sensitivity being lower than the first error sensitivity.

10. The method according to claim 1, further comprising the step of:

g) for each of the predetermined bit classes, increasing respective redundancy data of the error redundancy data for a corresponding class of the predetermined bit classes when a predetermined encoding gain is achieved.

11. The method according to claim 10, wherein, for each of the predetermined bit classes, the respective redundancy data is provided at an end portion of a corresponding bit class of the predetermined bit classes in a corresponding block.

12. The method according to claim 1, wherein steps a) through d) are executed during a connection setup phase in a channel encoder and in a corresponding channel decoder.

13. The method according to claim 1, wherein steps a) through d) are executed during a predetermined channel bit rate change in a channel encoder and in a corresponding channel decoder.

* * * * *

UNITED STATES PATENT AND TRADEMARK OFFICE
CERTIFICATE OF CORRECTION

PATENT NO. : 6,141,781
DATED : October 31, 2000
INVENTOR(S) : Joerg-Martin Mueller It is certified that error appears in the above-identified patent and that said Letters Patent is hereby corrected as shown below:

Title page,
ABSTRACT, delete "." after "scalable" and add -- channel codec ... --; delete "With the invention, it is possible to realize a scalable channel codec".

Column 1,
Line 17, change "describes" to -- describe --.

Column 2,
Line 17, change "as" to -- (as --.

Column 3,
Line 45, change "unprotected. ..." to -- unprotected). --.

Signed and Sealed this

Twelfth Day of February, 2002

Attest:

Attesting Officer

JAMES E. ROGAN
Director of the United States Patent and Trademark Office